United States Patent
Zhou et al.

(10) Patent No.: US 7,626,525 B2
(45) Date of Patent: Dec. 1, 2009

(54) FEED-FORWARD CIRCUITRY AND CORRESPONDING ERROR CANCELLATION CIRCUIT FOR CASCADED DELTA-SIGMA MODULATOR

(75) Inventors: Binling Zhou, Tucson, AZ (US); Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 390 days.

(21) Appl. No.: 11/799,879

(22) Filed: May 3, 2007

(65) Prior Publication Data

US 2008/0272944 A1 Nov. 6, 2008

(51) Int. Cl.
*H03M 3/00* (2006.01)

(52) U.S. Cl. .................. 341/143; 341/118; 341/120; 341/155

(58) Field of Classification Search ............. 341/118, 341/120, 143, 155
See application file for complete search history.

(56) References Cited

U.S. PATENT DOCUMENTS

| | | | | |
|---|---|---|---|---|
| 5,061,928 A | * | 10/1991 | Karema et al. | 341/143 |
| 5,103,229 A | * | 4/1992 | Ribner | 341/143 |
| 5,283,578 A | * | 2/1994 | Ribner et al. | 341/143 |
| 5,446,460 A | | 8/1995 | Cabler | |
| 5,648,779 A | * | 7/1997 | Cabler | 341/143 |
| 5,760,722 A | * | 6/1998 | Harris et al. | 341/143 |
| 5,949,361 A | * | 9/1999 | Fischer et al. | 341/143 |
| 6,323,794 B1 | * | 11/2001 | Okuda et al. | 341/143 |
| 6,400,295 B1 | | 6/2002 | Van Herzeele | |
| 6,496,128 B2 | * | 12/2002 | Wiesbauer et al. | 341/143 |
| 6,507,302 B2 | * | 1/2003 | Sakimura | 341/143 |
| 6,538,588 B1 | * | 3/2003 | Bazarjani | 341/143 |
| 6,734,814 B2 | * | 5/2004 | Okuda et al. | 341/143 |
| 6,762,703 B1 | * | 7/2004 | Tabatabaei | 341/143 |
| 6,920,182 B2 | * | 7/2005 | Bolton, Jr. | 375/247 |

* cited by examiner

*Primary Examiner*—Linh V Nguyen
(74) *Attorney, Agent, or Firm*—John J. Patti; Wade J. Brady, III; Frederick J. Telecky, Jr.

(57) ABSTRACT

A cascaded delta-sigma modulator includes a first stage delta-sigma modulator (10A) having first adder (2) followed by first (3) and second (6) integrators, a second adder (4), and a quantizer (7) the output of which is fed back to the first adder by an A/D (9). A gain circuit (5) is also connected between the first integrator and the second adder. The quantizer output is coupled by interstage circuitry to a second stage converter (100B) having a transfer function represented by the expression $OUT(z)=z^{-n}IN(z)+G(z)E2(z)$. An error cancellation circuit (12) includes inputs coupled to the output of the quantizer and an output of the second stage converter so as to provide a flat transfer function of the cascaded first stage delta-sigma modulator and second stage converter and the error cancellation circuit, despite non-flatness in a transfer function of the first stage delta-sigma modulator.

20 Claims, 8 Drawing Sheets

FEED-FORWARD CIRCUITRY AND CORRESPONDING ERROR CANCELLATION CIRCUIT FOR CASCADED DELTA-SIGMA MODULATOR

BACKGROUND OF THE INVENTION

The present invention relates generally to cascaded delta-sigma modulators, and more particularly to delta-sigma modulators that have flat transfer characteristics and reduced power dissipation, and which require reduced amounts of integrated chip area, and which are immune to the nonlinearity of the operational amplifier used to implement the integrator.

FIG. 1A is a block diagram of a conventional second order delta-sigma modulator 1A that is commonly used in cascaded delta-sigma modulators. Sometimes it is advantageous to cascade delta-sigma modulators. For example, cascading two second order delta-sigma modulators may provide a fourth-order delta-sigma modulator which is more stable than a traditional single stage fourth order delta-sigma modulator.

Second order delta-sigma modulator 1A in Prior Art FIG. 1A includes an analog adder 2 that receives an analog input signal X(z) and a feedback signal $V_{9A}$ on conductor 9A. The input of delta-sigma modulator 1A can be represented by x(t) in the time domain and by X(z) in the frequency domain, and similarly, the output of delta-sigma modulator 1A can be represented by y(t) in the time domain and by Y(z) in the frequency domain. The output of adder 2 is coupled to the input of a conventional switched capacitor integrator 3. The details of switched capacitor integrator 3 together with adder 2 are shown in FIG. 1B. The output 3A of integrator 3 is connected to the (+) input of an analog adder 4, the (−) input of which is coupled to the output of an analog gain block 5, more generally referred to herein as gain block 5, which actually is implemented by suitably sizing the capacitors in Prior Art FIG. 1B, wherein the gain of 2 is not formed by a separate amplifier circuit but instead is accomplished by making the capacitance Cin2 equal to twice the capacitance Cin1 in the circuit of FIG. 1B as it is utilized in implementing adder 4 and integrator 6. The output 4A of adder 4 is connected to the input of integrator 6. The output 6A of integrator 6 is coupled to the input of an A/D (analog to digital converter) or quantizer 7, which can be thought of as having an input which represents a quantization noise e(t), which in the frequency domain is represented by E(z). The output of A/D or quantizer 7 can be a one-bit or multi-bit digital output signal Y(z), which is applied to the input of a D/A (digital to analog converter) 9, the output 9A of which produces the feedback signal $V_{9A}$ applied to the input of gain block 5 and the (−) input of adder 2.

The frequency domain transfer characteristic of the second order delta-sigma modulator 1A is given by $$Y(Z)=Z^{-2}X(z)+(1z^{-1})^2E(z),\qquad\text{Eq. (1)}$$

wherein the variable "z" is a frequency-based transform variable. The outputs of first integrator 3 and second integrator 6 include input-dependant signal components. The transfer characteristic with respect to the signal on conductor 3A is indicated by the expression $z^{-1}(1+z^{-1})X(z)+z^{-}(1-z^{-1})E(z)$. This expression shows that the signal on conductor 3A is a function of the input signal X(z) and the quantization noise E(z). This is undesirable because the output signal swing of integrator 3 is dependent on the level of the input signal X(z). Any nonlinearity in the operational amplifier of integrator 3 produces distortion in the delta-sigma modulator output signal Y(z). Even though the quantization noise E(z) could be input related, the input-related term is high-pass filtered at the output of integrator 3 due to the $(1-z^{-1})$ term in Equation (1). The second order delta-sigma modulator 1A of FIG. 1A is very sensitive to non-linearity of the operational amplifier 11C (shown in subsequently described FIG. 1B) in integrator 3. Due to the limited output swing of the operational amplifier, the integrator capacitors Cint (shown in FIG. 1B) are quite large for delta-sigma modulator 1A in FIG. 1A and therefore require a substantial amount of integrated circuit chip area. Consequently, a considerable amount of power is required for integrators 3 to achieve fast signal settling.

Referring next to FIG. 1B, integrator 3 in combination with adder 2 in FIG. 1A can be implemented by a conventional switched-capacitor integrator, including an upper switched capacitor circuit 11A, which receives the differential input signal x(t), which is represented by X(z) in the frequency domain, and an operational amplifier 11C with to integrating capacitors Cint. Adder 2 is represented by a lower switched capacitor circuit 11B which receives the time domain feedback signal v9(t) on conductor 9A. Upper and lower switched-capacitor circuits 11A and 11B along with the corresponding (+) and (−) outputs of switched capacitor circuits 11A and 11B which are connected to the (+) and (−) inputs as shown, respectively, of operational amplifier 11C, perform the analog summing represented by analog summer 2 in FIG. 1A (and also in the other drawings herein). The differential output of operational amplifier 11C produces the time domain signal $v_{3A}(t)$.

FIG. 2 shows a conventional cascaded delta-sigma modulator 1B including two of the second order delta-sigma modulators 1A shown in FIG. 1A cascaded together. The upper delta-sigma modulator 1A-1 receives the input signal X(z). The output 9A of D/A 9 is connected to the (−) input of an analog adder 17, the (+) input of which is connected to the output 6A of integrator 6 of upper delta-sigma modulator 1A-1. This subtraction results in only quantization noise E1(z) being fed into the second stage 1A-2. (In the prior art cascaded delta-sigma modulators, the subtraction by adder 17 results in only E1(z) being fed into second stage 1A-2.) The output 17A of adder 17 is connected to the input of an interstage gain block 38 having a gain g. The output of gain block 38 is connected to the input of lower delta-sigma modulator 1A-2, which is identical to upper delta-sigma modulator 1A-1. Interstage gain block 38 ensurers that lower delta-sigma modulator 1A-2 does not saturate.

The outputs 7A of delta-sigma modulators 1A-1 and 1A-2 in FIG. 2 are connected to an all-digital error-cancellation circuit 12 (also referred to as "merging block 12"), which operates in the digital domain to cancel the quantization noise E1(z). The output of upper delta-sigma modulator 1A-1 is connected to the input of a digital delay block 13 of error cancellation circuit 12. The output of digital delay block 13 is connected to a (+) input of a digital adder 14. The output of lower delta-sigma modulator 1A-2 is connected to the input of a digital gain block 40 having a gain 1/g, in order to scale back the effect of interstage gain block 38 on the amplitude of the output of lower delta-sigma modulator 1A-2. The output of digital gain block 40 is connected to a digital block 16 with a transfer function $(1-z^{-1})^2$. The output of digital block element 16 is coupled to another (+) input of digital adder 14, the output of which produces the output signal Y(z) of cascaded delta-sigma modulator 1B.

Cascading the two second order delta-sigma modulators 1A-1 and 1A-2 in this manner causes fourth-order delta-sigma modulator 1B to be unconditionally stable compared to a traditional single-stage fourth order delta-sigma modulator.

The transfer characteristic of cascaded delta-sigma modulator 1B of FIG. 2 is given by $$Y(z) = [z^{-2}X(z) + (1-z^{-1})^2 E_1(z)]z^{-2} + \quad \text{Eq. (2)}$$
$$[z^{-2}(-E_1(z)g) + (1-z^{-1})^2 E_2(z)](1-z^{-1})^2/g$$
$$= z^{-4}X(z) + (1-z^{-1})^4 E_2(z)/g.$$

Equation (2) shows that cascaded delta-sigma modulator 1B is a fourth order delta-sigma modulator with quantization noise $E_1(z)$ canceled in the error-cancellation circuits, and the input transfer function is flat.

FIG. 3 shows a conventional low distortion second order delta-sigma modulator 1C that sometimes is used in cascaded delta-sigma modulators. Its transfer characteristic is given by $$Y(z) = X(z) + (1-z^{-1})^2 E(z). \quad \text{Eq. (3)}$$

The transfer characteristic respect to the signal on conductor 3A in FIG. 3 is indicated by the expression $-z^{-1}(1-z^{-1})E(z)$. In delta-sigma modulator 1C, the effective transfer characteristics at the output 3A of integrator 3 has only "$E(z)$" quantization noise terms. Even though the quantization noise $E(z)$ could be input related, the input-related term is high-pass filtered at the output of integrator 3 due to the $(1-z^{-1})$ term in the foregoing expression. Therefore, delta-sigma modulator 1C of FIG. 3 is more immune to non-linearity of the operational amplifiers of integrators 3. Furthermore, the output swing of integrator 3 is very stable for different levels of the input signal $X(z)$. The integrator capacitors Cint (FIG. 1B) do not need to be as large as in the above mentioned delta-sigma modulators of FIGS. 1A and 2, and consequently less power is required to achieve acceptable integrator signal settling.

However, delta-sigma modulator 1C requires a feed-forward path from the input signal $X(z)$ to the input of adder 4 ahead of A/D or quantizer 7. As will be readily understood by those skilled in the art, this feed-forward path may cause a "kick-back" effect on the input signal $X(z)$, causing signal distortion as a result of the summation of three signals being provided by adder 4 to the input of A/D or quantizer 7. Typically, the actual implementation of adder 4 includes a passive network wherein the two signals including integrator output 6A and the output 5A of gain block 5 can cause the above-mentioned kick-back effect which distorts input signal $X(z)$. The distorted input signal $X(z)$ then is operated on by the delta-sigma modulator, thereby increasing distortion in the output signal $Y(z)$.

FIG. 4 shows another low distortion second order delta-sigma modulator 10A which has several advantages over the above mentioned prior art second-order delta-sigma modulators. Second order delta-sigma modulator 10A of FIG. 4 includes an analog adder 2 that receives analog input signal $X(z)$ and a feedback signal on conductor 9A. The output of adder 2 is coupled to the input of switched-capacitor integrator 3. (FIG. 1B shows a preferred implementation of adder 2 and integrator 3.) The output 3A of integrator 3 is coupled to the input of a second integrator 6 which can be identical to integrator 3, and also is connected to the input of an gain block 5 having a gain equal to 2. The output 6A of integrator 6 is connected to a (+) input of an analog adder 4, another (+) input of which is coupled to the output of gain block 5. The output of adder 4 is connected to the input of A/D or quantizer 7, which can be thought of as having an input which represents a quantization noise $E(z)$. The output of A/D or quantizer 7 can be a one-bit or multi-bit digital output signal Y, which is applied to the input of a D/A converter 9. The output of D/A 9 produces the feedback signal $V_{9A}$ applied to the input of gain block 5 and the (−) input of adder 2. Note that low distortion second order delta-sigma modulator 10A in FIG. 4 is nearly identical to low distortion second order delta-sigma modulator 1C in FIG. 3, except that the feed-forward path in FIG. 3 from $X(z)$ to adder 4 is omitted in FIG. 4. Therefore, delta-sigma modulator 10A avoids the previously described kick-back problem.

The transfer characteristic of delta-sigma modulator 10A is given by $$Y(z) = z^{-1}(2-z^{-1})X(z) + (1-z^{-1})^2 E(z) \quad \text{Eq. (4)}$$
$$= X(z) + (1-z^{-1})^2(E(z) - X(z)).$$

$z^{-1}$ represents a time delay. Integrator 3 is a "delayed" integrator. The delay involved arises as a result of the time durations associated with the two clock signals shown in the switched-capacitor implementation of FIG. 1B. The transfer characteristic with respect to the signal on conductor 3A is indicated by the expression $-z^{-1}(1-z^{-1})(E(z)-X(z))$, wherein the term $(1-z^{-1})$ represents a high pass filter. The base band of interest is very low compared to the over-sampling frequency of the switched capacitor integrators 3, and the sampling frequency is much greater than the Nyquist rate. Even though the transfer characteristic at conductor 3A has an $X(z)$ term, it is greatly reduced because of the high pass filtering.

The output of the first integrator 3 only includes a high pass filtered input signal, which is likely to be negligible. This provides an advantage of low distortion second order delta-sigma modulator 10A of FIG. 4 over the low distortion delta-sigma modulator 1C of FIG. 3. This is in addition to the advantage that the kick-back effect is avoided and because no feed-forward path is required. However, the input-output transfer function of low distortion second-order delta-sigma modulator 10A, indicated by Equation (4), is not flat. Therefore, the correction block with transfer function $1/(2-z^{-1})$ needs to be added in the digital domain to cancel the "drooping" caused by the $(2-z^{-1})$ term in Equation (4). (The settling in error cancellation circuit 12 could be an issue because it is an IIR (infinite impulse response) filter, since IIR filters characteristically have slow settling.)

The performance of low distortion second order delta-sigma modulator 10A of FIG. 4 is fairly similar to that of delta-sigma modulator 1C of FIG. 3, except there is none of the above mentioned kick-back problem in the circuit of FIG. 4. Also, the transfer function of delta-sigma modulator 1C of FIG. 4 is not flat. Since its transfer function is not flat, second order delta-sigma modulator 10A of Prior Art FIG. 4 would not ordinarily be considered as a practical option for use in a cascaded delta-sigma modulator circuit.

Thus, there is an unmet need for a cascaded delta-sigma modulator that has a flat transfer characteristic and reduced power dissipation, which requires reduced amounts of integrated chip area, and which is immune to nonlinearity of the operational amplifier used to implement the integrator.

There also is an unmet need for a cascaded delta-sigma modulator which has a flat transfer characteristic and reduced power dissipation, which is immune to nonlinearity of the operational amplifier used to implement the integrator, and which requires reduced amounts of integrated chip area even though a delta-sigma modulator therein has a transfer characteristic which is not flat.

There also is an unmet need for a cascaded delta-sigma modulator which avoids distortion due to kick-back caused by a feed-forward signal path in a delta-sigma modulator therein.

SUMMARY OF THE INVENTION

It is an object of the invention to provide a cascaded delta-sigma modulator that has a flat transfer characteristic and reduced power dissipation, which requires reduced amounts of integrated chip area, and which is immune to nonlinearity of the operational amplifier used to implement the integrator.

It is another object of the invention to provide a cascaded delta-sigma modulator which has a flat transfer characteristic and reduced power dissipation, which is immune to nonlinearity of the operational amplifier used to implement the integrator, and which requires reduced amounts of integrated chip area even though a delta-sigma modulator therein has a transfer characteristic which is not flat.

It is another object of the invention to provide a cascaded delta-sigma modulator which avoids distortion due to kick-back caused by a feed-forward signal path in a delta-sigma modulator therein.

Briefly described, and in accordance with one embodiment, the present invention provides a cascaded delta-sigma modulator includes a first stage delta-sigma modulator (10A) having first adder (2) followed by first (3) and second (6) integrators, a second adder (4), and a quantizer (7) the output of which is fed back to the first adder by an A/D (9). A gain circuit (5) is also connected between the first integrator and the second adder. The quantizer output is coupled by interstage circuitry to a second stage converter (10B) having a transfer function represented by the expression OUT(z)=$z^{-n}$ IN(z)+G(z)E2(z). An error cancellation circuit (12) includes inputs coupled to the output of the quantizer and an output of the second stage converter so as to provide a flat transfer function of the cascaded first stage delta-sigma modulator and second stage converter and the error cancellation circuit, despite non-flatness in a transfer function of the first stage delta-sigma modulator.

In one embodiment, the invention provides a cascaded delta-sigma modulator including a first stage converter (100A) having a first stage delta-sigma modulator (10A) including first (2) and second (4) adders, first (3) and second (6) integrators, a gain circuit (5), and a quantizer (7). First and second inputs of the first adder (2) are coupled to an input signal (X(z)) and an output of the quantizer (7), respectively. An output of the first adder (2) is coupled to an input of the first integrator (3), an output of the first integrator (3) is coupled to an input of the second integrator (6) and an input of the gain circuit (5), first and second inputs of the second adder (4) is coupled to an output of the second integrator (6) and an output of the gain circuit (5), respectively, an output of the second adder (4) is coupled by means of a digital to all analog converter (9) to an input of the quantizer (7). A second stage converter (100B) has a transfer function represented by the expression OUT(z)=$z^{-n}$IN(z)+G(z)E2(z), where n can be any number, wherein OUT(z) and IN(z) are an output and input, respectively, of the second stage converter (100B) in the frequency domain, wherein $z^{-n}$ represents delay, G(z) represents a noise transfer function, and E2(z) represents noise in the second stage converter (100B). A first interstage circuit includes a first interstage gain circuit (18) having an input coupled to the output (6A) of the second integrator (6) of the first stage delta-sigma modulator (10A). In adder (17) of the first interstage circuit has a first input coupled to the output of the second integrator (6) of the first stage delta-sigma modulator (10A), a second input coupled to an output of the first interstage gain circuit (18), and an output coupled to an input of a second interstage gain circuit (38) having an output coupled to the input of the second stage converter (100B). An error cancellation circuit (12) includes a first input coupled to the output (7A) of the quantizer (7) of the first stage delta-sigma modulator (10A), a second input coupled to the output of the second stage converter (100B), and an output producing an output signal (Y(z)) so as to provide a flat transfer function of the cascaded first (100A) and second (100B) stage converters and the error cancellation circuit (12), despite non-flatness in a transfer function of the first stage second order delta-sigma modulator (10A).

In one embodiment, the second stage converter (100B) includes a second stage delta-sigma modulator (1A or 10H) including a first adder (2 or 19) having an output coupled to an input of a first integrator (3 or 20) of the second stage delta-sigma modulator (1A or 10H). The first integrator of the second stage delta-sigma modulator has an output coupled to an input of a quantizer (7 or 24) of the second stage delta-sigma modulator. The quantizer of the second stage delta-sigma modulator has an output coupled to a first input of the first adder (2 or 19) of the second stage delta-sigma modulator. In one embodiment, the first stage delta-sigma modulator (10A) does not include any feed-forward paths from the input signal (X(z)) to the second adder (4) of the first stage delta-sigma modulator (10A).

In one embodiment, the quantizer (7) of the first stage delta-sigma modulator (10A) is a multi-bit quantizer. In another embodiment, the quantizer is a 1-bit quantizer.

In one embodiment, the first stage delta-sigma modulator (10A) is a second order delta-sigma modulator (10A of FIG. 4) having a transfer function (Eq.4) defined by Y(z)=X(z)+$(1-z)^2$(E(z)–X(z)) where Y(z), X(z), and E(Z) represent the output, input, and quantization error, respectively, of the first stage delta-sigma modulator (10A) in the frequency domain. In another embodiment, the second stage delta-sigma modulator (1A) is a second order delta-sigma modulator (1A of FIG. 1) having a transfer function defined by Y(z)=$z^{-2}$X(z)+$(1-z^{-1})^2$E(z) where Y(z), X(z), and E(z) represent the output, input, and quantization error, respectively, of the second stage delta-sigma modulator (1A) in the frequency domain, and wherein the cascaded delta-sigma modulator (10B) has a transfer function (Eq.5) defined by Y(z)=$z^{-4}$X(z)+$(1-z^{-1})^4$$E_2$(z)/g where Y(z) and X(z) represent the output and the input, respectively, of the cascaded delta-sigma modulator (10B) and $E_2$(z) represents quantization error associated with the second stage delta-sigma modulator (1A) and g represents gain of the second interstage gain circuit (38).

In one embodiment, the first integrator (3) and second integrator (6) of the first stage delta-sigma modulator (10A) are switched capacitor integrators each including a first switched capacitor sampling circuit (11A) for sampling the input signal (X(z)) and an integrating operational amplifier (11C,Cint) having a differential input coupled to a differential output of the first switched capacitor sampling circuit (11A). The first adder (2) of the first stage delta-sigma modulator (10A) includes a second switched capacitor sampling circuit (11B) having an input coupled to sample an output of the digital to analog converter (9) and a differential output connected to the differential input of the integrating operational amplifier (11C,Cint).

In one embodiment, the second stage delta-sigma modulator is a first order delta-sigma modulator (10H) and the cascaded delta-sigma modulator (10D) has a transfer function (Eq.7) defined by Y(z)=$z^{-3}$X(z)+$(1-z^{-1})^3$$E_2$(Z)/g where Y(z) and X(z) represent the output and input, respectively, of the cascaded delta-sigma modulator (10D), $E_2(z)$ represents quantization noise of the first order delta-sigma modulator (10H) of the second stage delta-sigma modulator (10H), and g represents gain of the second interstage gain circuit (38). In another embodiment, the first stage delta-sigma modulator (10A) is a second order delta-sigma modulator (10A) having a transfer function (Eq.4) defined by $Y(z)=X(z)+(1-z^{-1})^2(E(z)-X(z))$ where $Y(z)$, $X(z)$, and $E(z)$ represent the output, input, and quantization noise, respectively, of the second order delta-sigma modulator (10A) in the frequency domain, and the second stage delta-sigma modulator (1A) is a second order delta-sigma modulator (1A) having a transfer function (Eq. 1) defined by $Y(z)=z^{-12}X(Z)+(1-z^{-1})^2E(z)$ where $Y(z)$, $X(z)$, and $E(z)$ represent the output, input, and quantization noise, respectively, of the second stage delta-sigma modulator (1A) in the frequency domain. The cascaded delta-sigma modulator (10C) further includes a third stage delta-sigma modulator (10F) which is a first order delta-sigma modulator, the cascaded delta-sigma modulator (10C) having a transfer characteristic (Eq.6) defined by $Y(z)=z^{-5}X(z)+(1-z^{-1})^5E_3(z)/g1g2$ where $Y(z)$ and $X(z)$ represent the output and input, respectively, of the cascaded delta-sigma modulator (10C) in the frequency domain, $E_3(z)$ represents quantization noise of the third stage delta-sigma modulator (10F), g1 represents gain of the second interstage gain circuit (38), and g2 represents gain of an interstage gain circuit (42) coupled between the second stage delta-sigma modulator (1A) and the third stage delta-sigma modulator (10F).

In one embodiment, the second stage delta-sigma modulator is a first order delta-sigma modulator (10H-1) and the cascaded delta-sigma modulator (10D) further includes a third stage delta-sigma modulator (10H-2) which is a first order delta-sigma modulator, the cascaded delta-sigma modulator (10E) having a transfer characteristic (Eq.8) defined by $Y(z)=z^{-4}X(z)+(1-z^{-1})^4E_3(z)/(g1g2)$ where $Y(z)$ and $X(z)$ represent the output and input, respectively, of the cascaded delta-sigma modulator (10E) in the frequency domain, $E_3(z)$ represents quantization noise of the third stage delta-sigma modulator (10H-2), g1 represents gain of the second interstage gain circuit (38), and g2 represents gain of an interstage gain circuit (42) coupled between the second stage delta-sigma modulator (10H-1) and the third stage delta-sigma modulator (10H-2), wherein the error cancellation circuit (12) includes a third input coupled to an output of a quantizer (35) of the third stage delta-sigma modulator (10H-2).

In one embodiment, the error cancellation circuit (12) includes a first digital delay circuit (13) having an input coupled to the output (7A) of the quantizer (7) of the first stage delta-sigma modulator (10A) and an output (13A) coupled to an input of a second digital delay circuit (28) and to an input of a first digital gain circuit (15). An output of the second digital delay circuit (28) is coupled to a first input of a first digital adder (14). A second digital gain circuit (40) has an input coupled to the output of the second stage converter (100B) and an output coupled to a first input of a second digital adder (21). The second digital adder (21) has a second input coupled to an output of the first digital gain circuit (15) and an output coupled to an input of a digital filter circuit (16). The digital filter circuit (16) has an output coupled to a second input of the first digital adder (14).

In one embodiment, the cascaded delta-sigma modulator includes a third stage delta-sigma modulator (10F) having an input coupled to the output of the second stage delta-sigma modulator (1A or 10H) and the error cancellation circuit (12) includes a first digital delay circuit (13) having an input coupled to the output (7A) of the quantizer (7) of the first stage delta-sigma modulator (10A) and an output (13A) coupled to an input of a second digital delay circuit (28) and to an input of a first digital gain circuit (15). An output of the second digital delay circuit (28) is coupled to a first input of a first digital adder (14). A second digital gain circuit (40) has an input coupled to the output of the second stage converter (100B) and an output coupled to a first input of a second digital adder (21). The second digital adder (21) has a second input coupled to an output of the first digital gain circuit (15) and an output coupled to an input of a first digital filter circuit (16). The first digital filter circuit (16) has an output coupled to a second input of the first digital adder (14). The error cancellation circuit (12) also includes a third digital gain circuit (44) having an input coupled to the output (35A) of the third stage delta-sigma modulator (10F) and an output coupled to a first input of a third digital adder (49). The output of the second digital gain circuit (40) is coupled to an input of a third digital delay element (46) having an output coupled to an input of a fourth digital gain circuit (47) which has an output coupled to a second input of the third digital adder (49). The third digital adder (49) has an output coupled to an input of a second digital filter circuit (30) having an output coupled to a third input of the first digital adder (14).

In one embodiment, the invention provides method of cascading a first stage converter (100A) and a second stage converter (100B), including providing in the first stage converter (100A) a first stage delta-sigma modulator (10A) including first (2) and second (4) adders, first (3) and second (6) integrators, a gain circuit (5), and a quantizer (7), first and second inputs of the first adder (2) being coupled to an input signal $(X(z))$ and an output of the quantizer (7), respectively, an output of the first adder (2) being coupled to an input of the first integrator (3), an output of the first integrator (3 being coupled to an input of the second integrator (6) and an input of the gain circuit (5), first and second inputs of the second adder (4) being coupled to an output of the second integrator (6) and an output of the gain circuit (5), respectively, an output of the second adder (4) being coupled to an input of the quantizer (7), coupling the output (7A) of the quantizer (7) to an input of the second stage converter (100B), wherein the second stage converter (100B) has a transfer function represented by the expression $OUT(z)=z^{-n}IN(z)+G(z)E2(z)$, where n can be any number, wherein $OUT(z)$ and $IN(z)$ are the output and input, respectively, of the second stage converter (100B) in the frequency domain, wherein $z^{-n}$ represents delay, $G(z)$ represents a noise transfer function, and $E2(z)$ represents any noise in the second stage converter 100B, and coupling the output of the quantizer (7) of the first stage delta-sigma modulator (10A) and an output of the second stage converter 100B) to first and second inputs, respectively, of an error cancellation circuit (12) including a first input coupled to the output of the quantizer (7) of the first stage delta-sigma modulator (10A), a second input coupled to the output of the second stage converter (100B) so as to provide a flat transfer function of the cascaded first (100A) and second (100B) stage converters and the error cancellation circuit (12) in combination despite non-flatness in a transfer function of the first stage delta-sigma modulator (10A). The first stage delta-sigma modulator (10A) is provided with a transfer characteristic defined by $Y(z)=X(z)+(1-z^{-1})^2(E(z)-X(z))$ where $Y(z)$, $X(z)$, and $E(Z)$ represent the output, input, and quantization error, respectively, of the first stage delta-sigma modulator (10A) in the frequency domain.

In one embodiment, the invention provides a cascaded delta-sigma modulator including a first stage converter (100A) including a first stage delta-sigma modulator (10A) means which includes first (2) and second (4) adders, first (3)

and second (6) integrators, a gain circuit (5), and a quantizer (7), first and second inputs of the first adder (2) being coupled to an input signal (X(z)) and an output of the quantizer (7), respectively, an output of the first adder (2) being coupled to an input of the first integrator (3), an output of the first integrator (3) being coupled to an input of the second integrator (6) and an input of the gain circuit (5), first and second inputs of the second adder (4) being coupled to an output of the second integrator (6) and an output of the gain circuit (5), respectively, an output of the second adder (4) being coupled to an input of the quantizer (7), means for coupling the output (7A) of the quantizer (7) to an input of second stage converter (100B) means which has a transfer function represented by the expression OUT(z)=$z^{-n}$IN(z)+G(z)E2(z), where n can be any number, wherein OUT(z) and IN(z) are the output and input, respectively, of the second stage converter (100B) in the frequency domain, wherein $z^{-n}$ represents delay, G(z) represents a noise transfer function, and E2(z) represents noise in the second stage converter 100B, and means for coupling the output of the quantizer (7) to an input of the second stage converter means (100B), and error cancellation circuit means (12) including a first input coupled to the output of the quantizer (7) of the first stage delta-sigma modulator (10A), a second input coupled to the output of the second stage converter means (100B), and an output producing an output signal (Y(z)) so as to provide a flat transfer function of the cascaded first (100A) and second (100B) stage converter means and the error cancellation circuit (12) in combination despite non-flatness in a transfer function of the first stage delta-sigma modulator (10A).

DETAILED DESCRIPTION OF THE PREFERRED EMBODIMENTS

Figure 2:
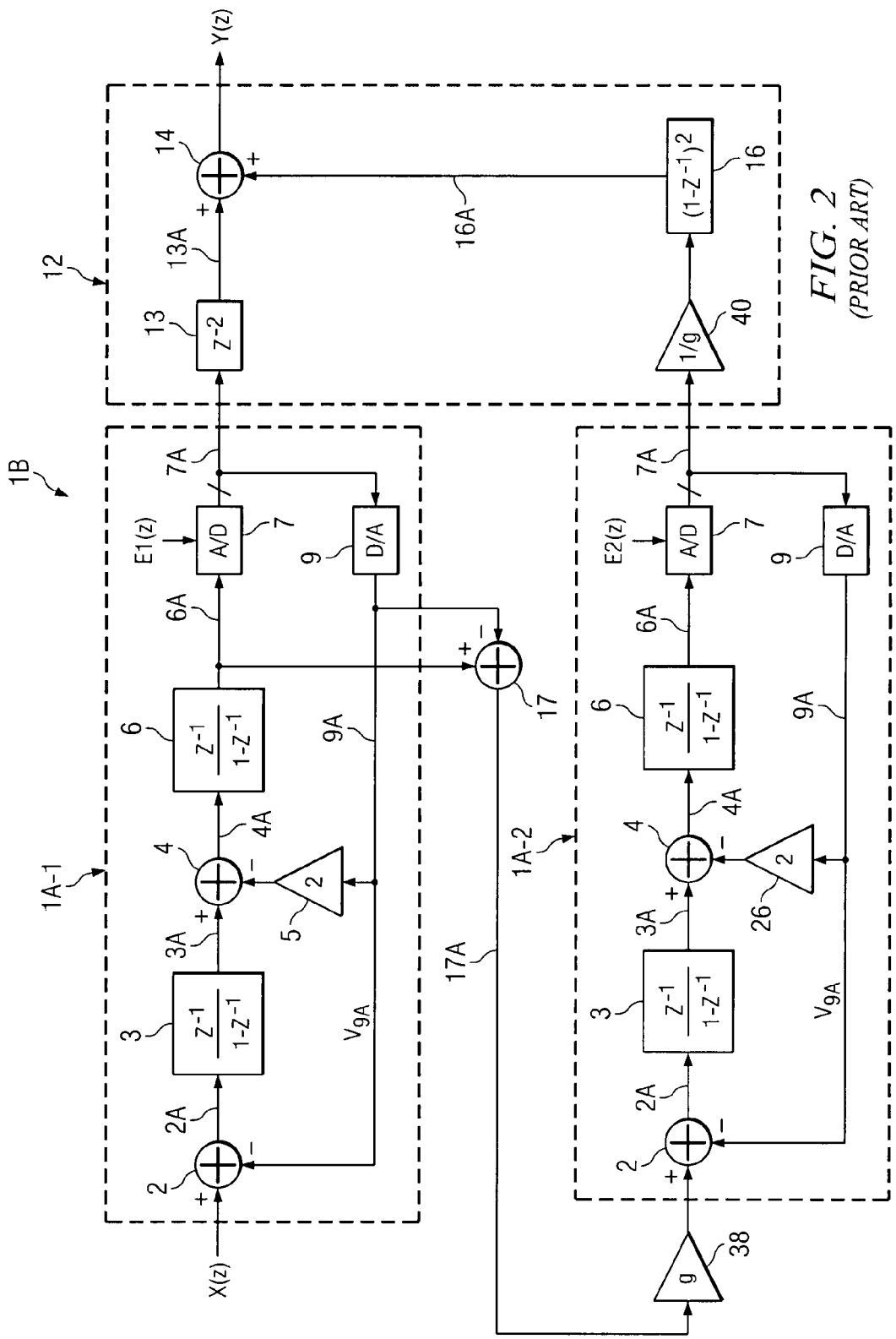
FIG. 2 is a block diagram of a traditional cascaded delta-sigma modulator including two of the second-order delta-sigma modulators of FIG. 1A.
Figure 4:
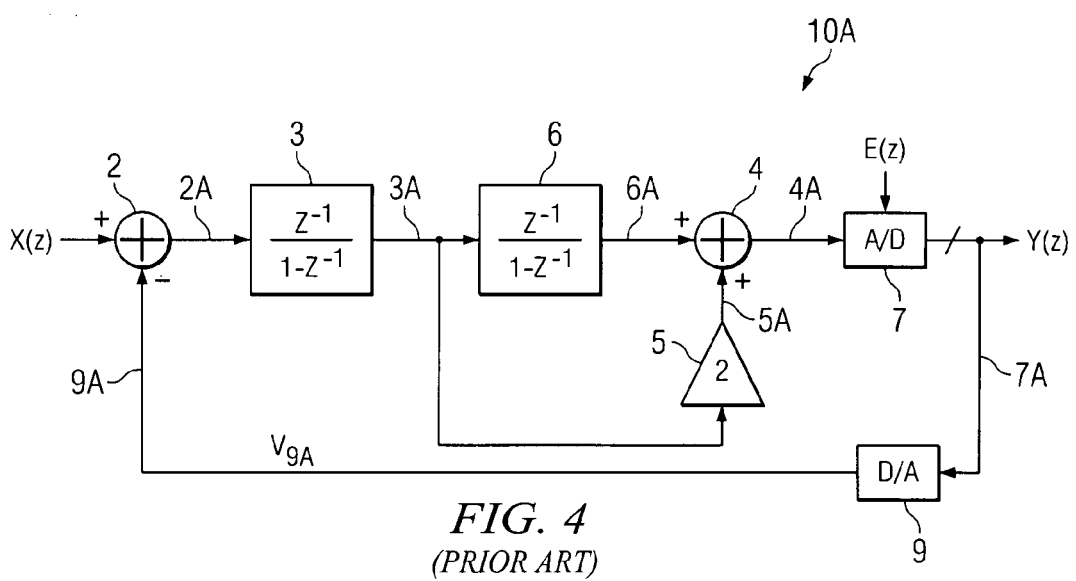
FIG. 4 is a block diagram of another prior art low distortion second order delta-sigma modulator.
Figure 5A:
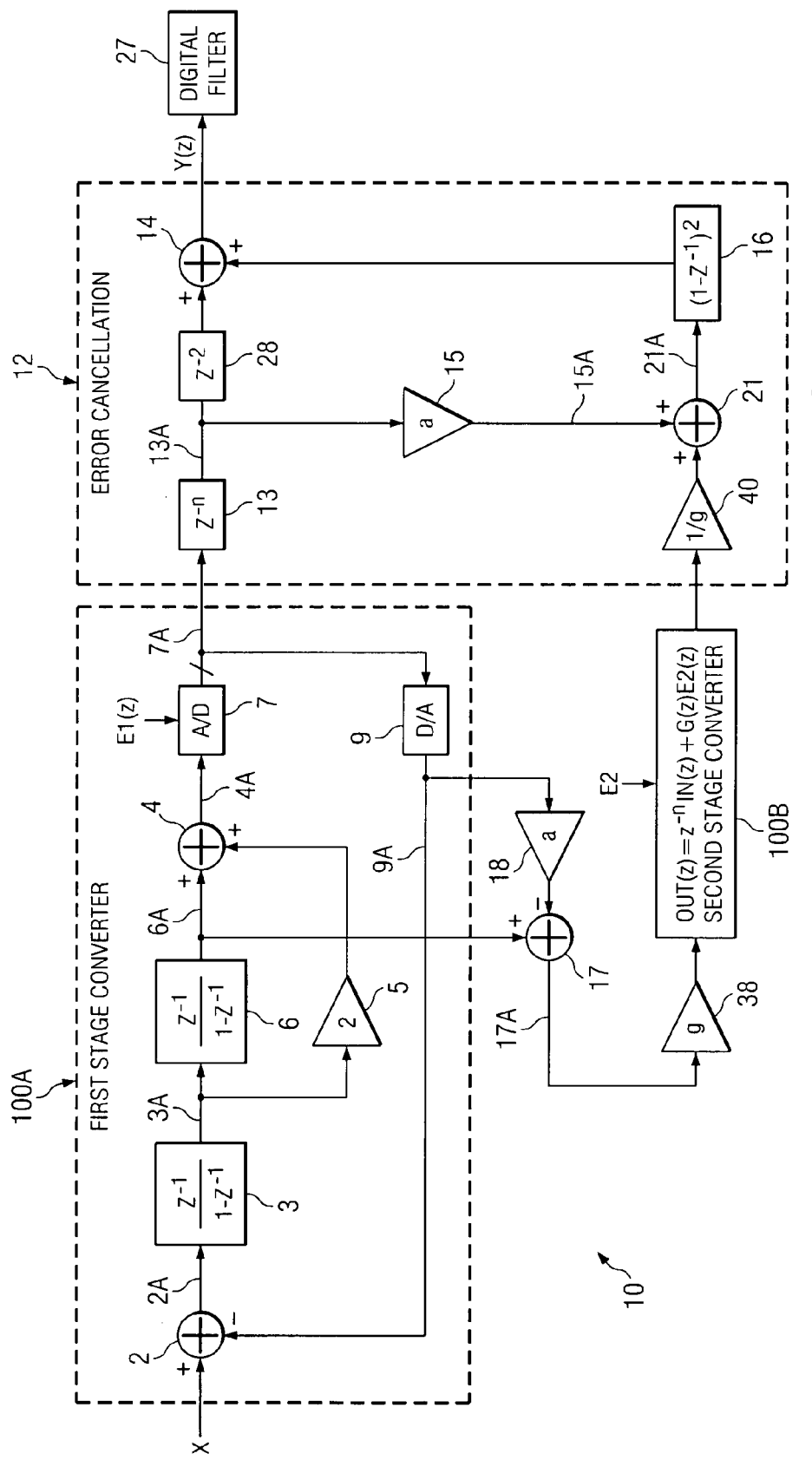
FIG. 5A is a generalized block diagram of a cascaded delta-sigma modulator of the present invention including the delta-sigma modulator of FIG. 4 as a first stage and a generalized converter as a second stage.

Referring to FIG. 5A, a cascaded delta-sigma modulator 10 includes a first stage converter 100A which may include a second order delta-sigma modulator 10A that can be the same as delta-sigma modulator 10A of Prior Art FIG. 4. First stage converter 100A is connected in cascaded relationship with a second stage converter 100B. The outputs of first stage converter 100A and second stage converter 100B in FIG. 5A are connected to corresponding inputs of error cancellation circuit 12, which can be the same as error cancellation circuit 12 in Prior Art FIG. 2.

Figure 1A:
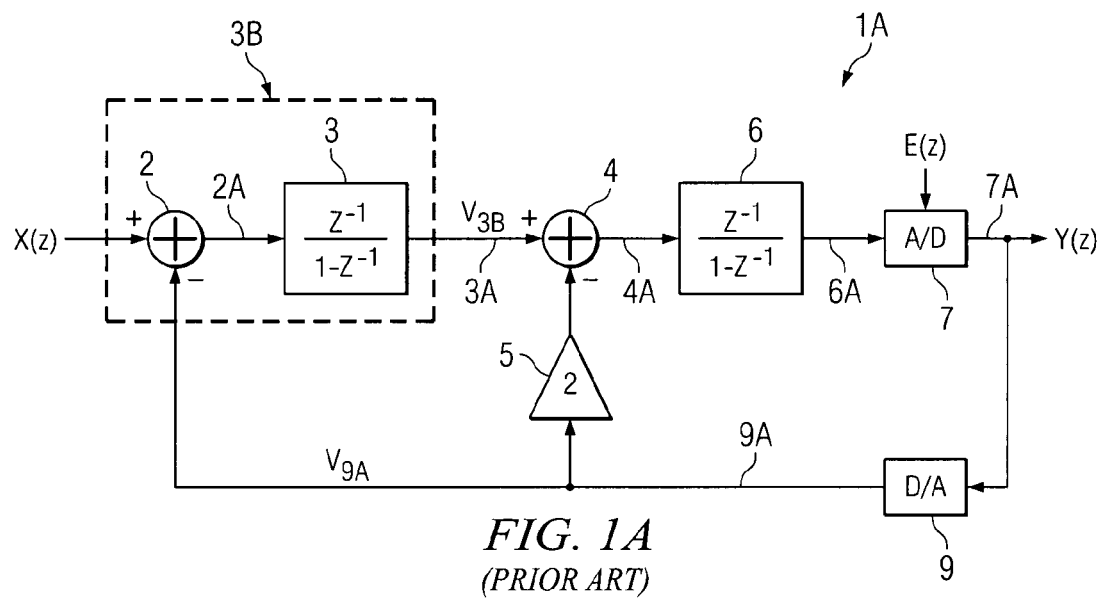
FIG. 1A is a block diagram of a traditional second-order delta-sigma modulator.
Figure 1B:
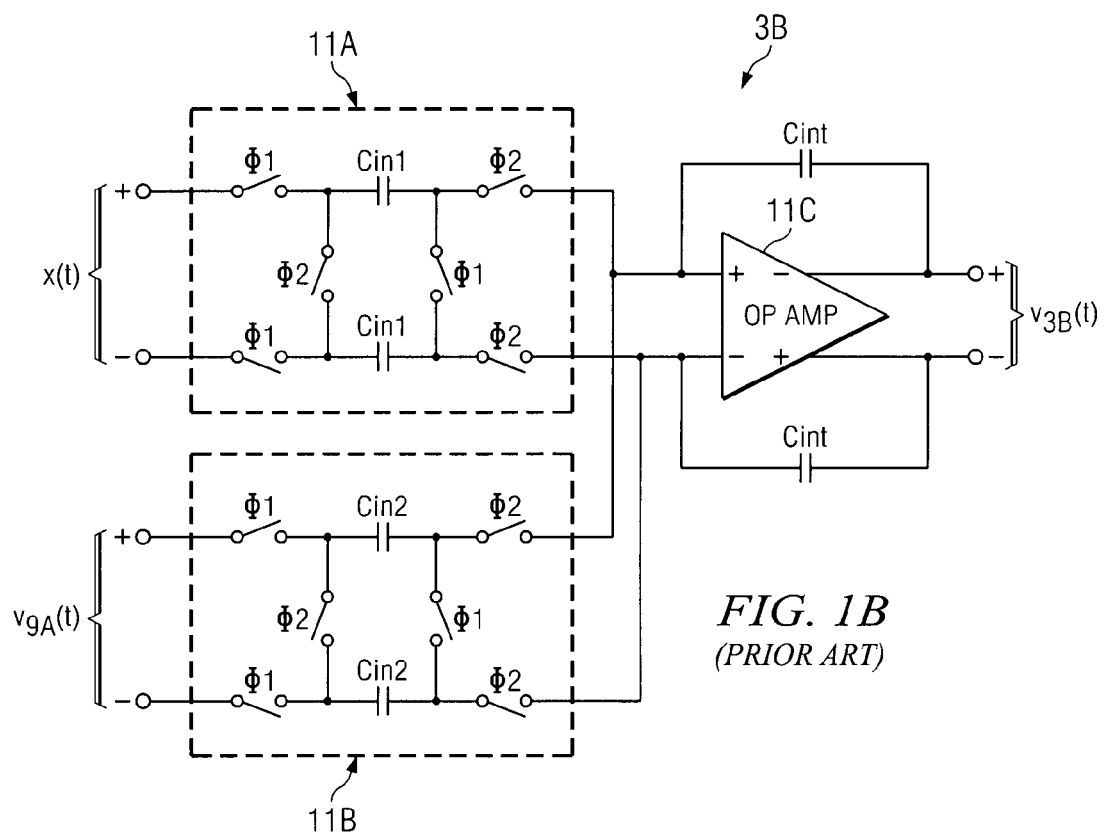
FIG. 1B is a schematic diagram of a switched capacitor realization of an integrator including two switched capacitor circuits operating to over-sample and the sum two operational input signals into an integrating amplifier.

Second-order delta-sigma modulator 10A shown in first stage converter 100A includes analog adder 2, which receives analog input signal X(z) and a feedback signal $V_{9A}$ on conductor 9A. The output of adder 2 is connected to the input of switched capacitor integrator 3. (FIG. 1B shows a preferred switched capacitor implementation 3B of adder 2.together with integrator 3.) The output 3A of integrator 3 is connected to the input of a second integrator 6. Integrator 6 can be identical to integrator 3, which includes switched capacitor circuit 11A and integrating operational amplifier 11C in FIG. 1B. Output 3A of integrator 3 also is connected to the input of a gain block 5 having a gain equal to 2. (Gain block 5 actually is implemented by suitably sizing the capacitors in Prior Art FIG. 1B, wherein the gain of 2 is not actually provided by a separate analog amplifier circuit but instead is accomplished by making the capacitance Cin2 equal to twice the capacitance Cin1.) The output 6A of integrator 6 is connected to a (+) input of analog adder 4, another (+) input of which is connected to the output of gain block 5. The output 4A of adder 4 is connected to the input of A/D or quantizer 7, which can be thought of as having an input that represents a quantization noise E1(z). The output of A/D or quantizer 7 can be a one-bit or multi-bit digital output signal Y(z), which is applied to the input of a D/A 9. The output of D/A 9 produces feedback signal $V_{9A}$, which is applied to the (−) input of adder 2.

The output 9A of delta-sigma modulator 10A is coupled to the input of gain block 18, which has a gain of "a". The output of gain block 18 (which could be but is not necessarily an analog amplifier) is connected to the (−) input of analog adder 17, the (+) input of which is connected to the output 6A of integrator 6 of upper delta-sigma modulator 10A. The output 17A of adder 17 is connected to the input of interstage gain block 38, which has a gain g so as to ensure that second stage converter 100B does not saturate. The gain of "a" can be optimized by conventional simulation techniques to maximize inter-stage gain "g" while preventing any saturation of second stage converter 100B.

Second stage converter 100B can include any of a number of different kinds of conversion circuits, for example a flash A/D converter, a pipeline A/D converter, a single-stage delta sigma modulator, or cascaded delta sigma modulator.

Second stage converter 100B has a generalized transfer characteristic represented by the expression OUT(z)=$z^{-n}$IN (z)+G(z)E2(z), where n can be any number, wherein OUT(z) and IN(z) are the output and input, respectively, of second stage converter 100D in the frequency domain, wherein $z^{-n}$ represents delay, G(z) can represent an arbitrary function (such as noise shaping in a delta-sigma modulator or a constant in a flash converter or pipeline converter), and E2(z) can represent any noise in second stage converter 100B.

The output of upper delta-sigma modulator 10A is connected to the input of a digital delay block 13 of error cancellation circuit 12. The output of block 13 is connected to the (+)

input of digital adder 14 and also to the input of a digital gain block 15, the output of which is connected to a (+) input of digital adder 21. The output of lower delta-sigma modulator 1A is connected to the input of gain block 40, which has a gain 1/g so as to scale back the effect the gain g of interstage gain block 38 on the magnitude of the output of lower delta-sigma modulator 1A. The output 15A of digital gain block 15 is connected to another (+) input of digital adder 21, the output of which is input to a digital block 16. The output of digital block 16 is coupled to another (+) input of digital adder 14, the output of which produces the output signal Y(z) of cascaded delta-sigma modulator 1B.

The transfer characteristic of cascaded delta-sigma modulator 10 of FIG. 5A is given by $$Y(z) = \left[X(z) + (1-z^{-1})^2(E_1(z) - X(z))\right]z^{-(n+2)} + \quad \text{Eq. (5A)}$$
$$[z^{-n}(-z^{-2}(E_1(z) - X(z))g) + G(z)E_2(z)]$$
$$(1-z^{-1})^2/g$$
$$= z^{-(n+2)}X(z) + (1-z^{-1})^2 G(z)E_2(z)/g.$$

Normally only the quantization noise cause by the second order delta-sigma modulator 10A included in first stage converter 100A is fed into the next stage converter 100B, is digitized, and then is canceled in the all-digital error-cancellation circuit 12. Because the transfer function, Equation (4), of first stage delta-sigma modulator 10A in first stage converter 100A is not flat, the quantization noise E1(z) from first stage converter 100A together with an input-related signal component is fed into second converter stage 100B and then is digitized thereby. In the error cancellation circuit 12, not only is the quantization noise E1(z) from the first stage converter 100A canceled as in the prior art, but the non-flatness of the input-output transfer function, i.e., Equation (4), is corrected by the applying of the input-related signal component from the second converter stage 100B into error cancellation circuit 12.

The output Y(z) of generalized cascaded modulator 10 is typically applied to the input of a digital filter 27, which can function as a low-pass digital decimation filter to provide an output signal OUT from which high frequency noise has been filtered. (This is necessary because the frequency of Y(z) typically is much higher than the bandwidth of the input X(z), due to oversampling of X(z) by the usual switched capacitor circuitry.)

Figure 5B:
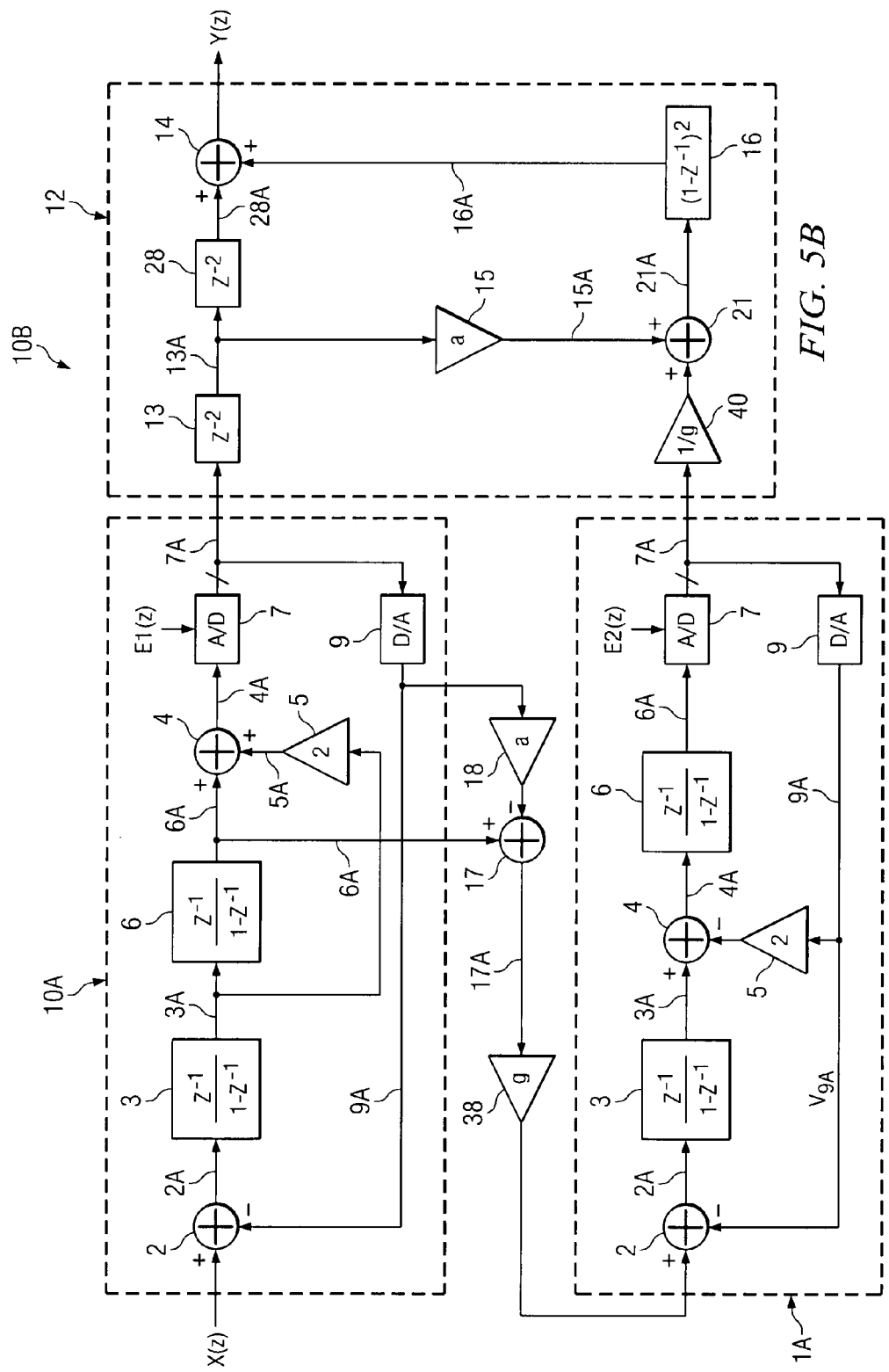
FIG. 5B is a block diagram of a cascaded delta-sigma modulator of the present invention including the delta-sigma modulator of FIG. 4 as a first stage and the delta-sigma modulator of FIG. 1A as a second stage.

FIG. 5B shows a cascaded delta-sigma modulator 10B which is one implementation of cascaded delta-sigma modulator 10 of FIG. 5A. In FIG. 5B, first stage converter 100A includes upper second order delta-sigma modulator 10A, which can be the same as delta-sigma modulator 10A of Prior Art FIG. 4. Second stage converter 100B includes lower order delta-sigma modulator 1A, which can be the same as delta-sigma modulator of Prior Art FIG. 1A. The outputs of delta-sigma modulators 10A and 1A in FIG. 5B are connected to the inputs of error cancellation circuit 12, which can be the same as in FIG. 5A.

Delta-sigma modulator 10A in FIG. 5B is the same as shown in first stage converter 100A in FIG. 5A.

The output of gain block 38 is connected to the input of lower delta-sigma modulator 1A, which includes analog adder 2 receiving the output of gain block 38 and a feedback signal $V_{9A}$ on conductor 9A. In lower delta-sigma modulator 1A, the output of adder 2 is coupled to the input of switched capacitor integrator 3. The output 3A of integrator 3 is connected to the (+) input of analog adder 4, the (−) input of which is coupled to the output of gain block 5. The output 3A of adder 4 is connected to the input of integrator 6 in lower delta-sigma modulator 1A. The output of integrator 6 in lower delta-sigma modulator 1A is coupled to the input of A/D or quantizer 7 thereof, which can be thought of as having an input a E2(z) which represents quantization noise. The output 7A of A/D or quantizer 7 is applied to the input of D/A 9, the output of which produces the feedback signal $V_{9A}$ applied to the input of gain block 5 and the (−) input of adder 2 of lower delta-sigma modulator 1A.

Error cancellation circuit 12 in FIG. 5B can be the same as in FIG. 5A, and operates in the digital domain to cancel quantization noise in response to the outputs of upper and lower second-order delta-sigma modulators 10A and 1A.

The transfer characteristic of cascaded delta-sigma modulator 10B of FIG. 5B is given by $$Y(z) = \left[X(z) + (1-z^{-1})^2(E_1(z) - X(z))\right]z^{-4} + \quad \text{Eq. (5)}$$
$$\left[z^{-2}(-z^{-2}(E_1(z) - X(z))g) + (1-z^{-1})^2 E_2(z)\right]$$
$$(1-z^{-1})^2/g$$
$$= z^{-4}X(z) + (1-z^{-1})^4 E_2(z)/g.$$

Those skilled in the art will recognize that the transfer characteristic of Equation (5B) is flat, even though the transfer characteristics of its constituent first stage second order delta-sigma modulator 10A is not flat and, instead is characterized by "drooping" at higher frequencies. The relative flatness of the transfer characteristic is due to the dominant term $z^{-4}X(Z)$ in Equation (5B). Furthermore, the quantization noise E1(z) is canceled, and the quantization noise E2(z) is substantially attenuated by the high-pass filtering represented by the $(1-z^{-1})^4$ fourth order high pass filtering term.

In contrast to the prior art, it is believed that no one has previously attempted to use low-distortion second order delta-sigma modulator 10A of FIG. 4 in a cascaded delta-sigma modulator, mainly because the transfer characteristic of delta-sigma modulator 10A is not flat. However, the cascading of second order delta-sigma modulators 10A and 1A in above described manner has been found to provide a fourth-order delta-sigma modulator which has a flat transfer characteristic, and is more stable than a traditional single stage fourth order delta-sigma modulator. The cascading of second order delta-sigma modulators 10A and 1A also avoids the distortion problems due to the kick-back that ordinarily would be caused by use of a delta-sigma modulator having a signal feed-forward paths.

Figure 6:
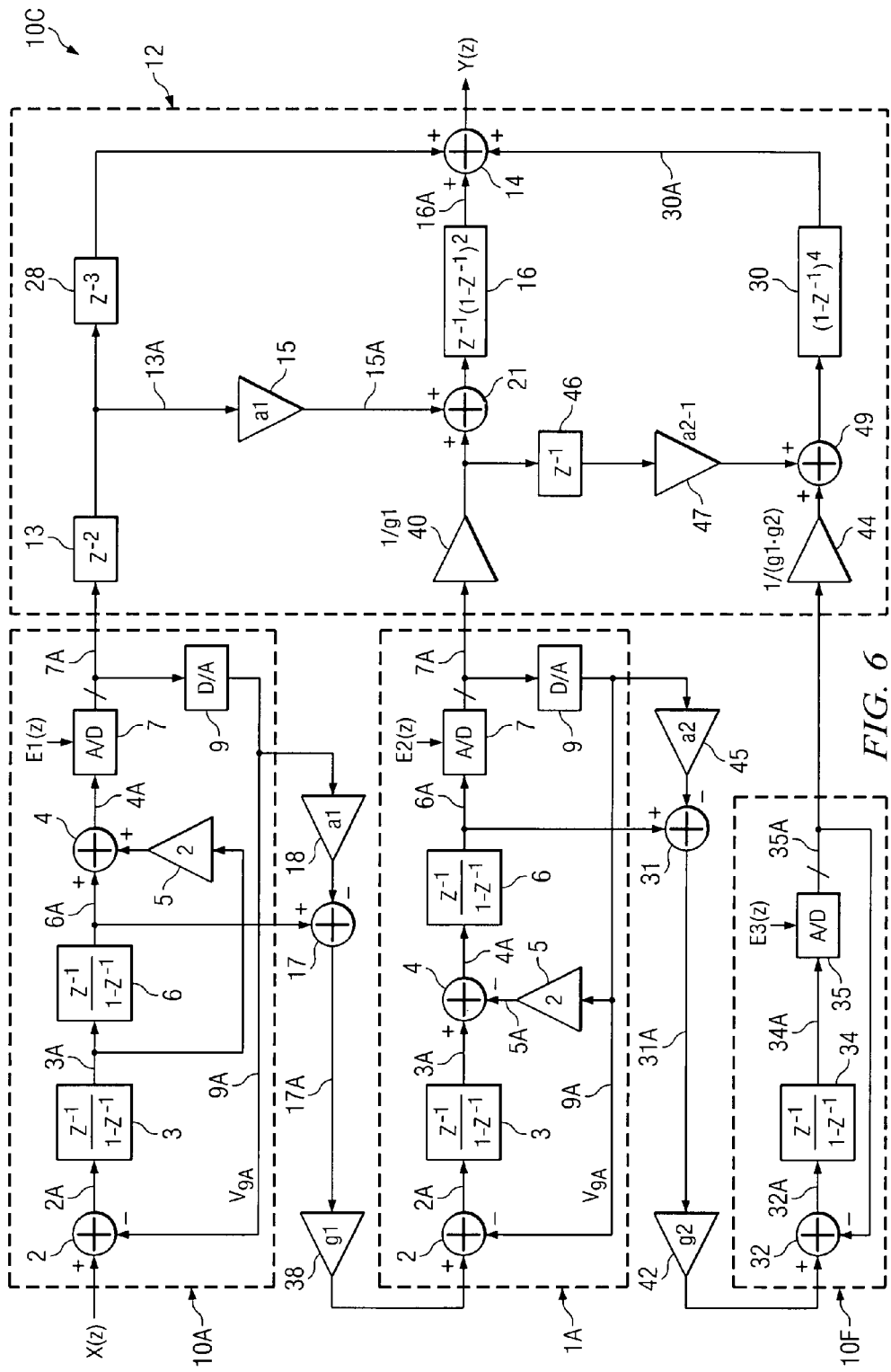
FIG. 6 is a block diagram of a cascaded delta-sigma modulator including the cascaded delta-sigma modulator of FIG. 5B as its first two stages and further including a first order delta-sigma modulator as a third stage.

FIG. 6 is a block diagram of a cascaded delta-sigma modulator 10C which includes the cascaded delta-sigma modulator 10B of FIG. 5B and further includes a first order delta-sigma modulator 10F as a third stage and additional digital circuitry in the error cancellation circuit 12, including a digital delay circuit 46, a digital gain block 47, a digital gain block 44, and a high-pass digital filter 30. First order delta-sigma modulator 10F in FIG. 6 includes an analog adder 32 having an output 32A connected to the input of a switched capacitor integrator 34. The output 34A of integrator 34 is connected to the input of A/D or quantizer 35, the output 35A of which is connected to the (−) input of adder 32 and to a third input of error cancellation circuit 12. Quantization noise E3(z) can be considered to be an additional input to A/D or quantizer 35.

The input of first order delta-sigma modulator 10F in FIG. 6 is connected to the output of an analog gain block 42 having a gain g2. The input of gain block 42 is connected to the output 31A of an analog adder 31 having a (+) input connected to the output 6A of integrator 6 of second order delta-sigma modulator 1A. The (−) input of adder 31 is connected to the output of an gain block 45 having a gain of a2. The input of gain block 45 is connected to the output 9A of D/A 9 of second order delta-sigma modulator 1A.

The output 35A of first order delta-sigma modulator 10B is connected to the input of digital gain block 44, which has a gain of 1/(g1g2), in error cancellation circuit 12. The output of digital gain block 44 is connected to a (+) input of a digital adder 49, the output of which is connected to the input of a fourth order high pass filter 30. The output of high-pass filter 30 is connected to a (+) input of digital adder 14. The output of digital gain block 40 of error cancellation logic 12 is connected to the input of a delay block 46, the output of which is connected to the input of a digital gain block 47 having a gain of a2−1. The output of digital gain block 47 is connected to another (+) input of digital adder 49.

The transfer characteristic of cascaded delta-sigma modulator 10C of FIG. 6 is given by $$Y(z) = [X(z) + (1-z^{-1})^2(E_1(z) - X(z))]z^{-5} + \qquad \text{Eq. (6)}$$
$$[z^{-2}(-z^{-2}(E_1(z) - X(z))g1) + (1-z^{-1})^2 E_2(z)]$$
$$z^{-1}(1-z^{-1})^2 / g1 + [z^{-1}(-E_2(z)g2) + (1-z^{-1})E_3(z)]$$
$$(1-z^{-1})^4 / g1g2$$
$$= z^{-5} X(z) + (1-z^{-1})^5 E_3(z) / g1g2.$$

As in Equation (5B), the transfer characteristic represented by Equation (6) indicates the same three inputs, i.e., the input signal X(z) and the quantization error terms E1(z), E2(z) and E3(z) associated with the three delta-sigma modulators 10A, 1A and 10F. The delay associated with the $z^{-5}X(Z)$ term in Equation (6) results in a flat transfer characteristic, and E1(z) and E2(z) are canceled out by the error cancellation logic. The term E3(z) is substantially attenuated by the $(1-z^{-1})^5$ term, which represents a fifth order high-pass filter function.

Figure 7:
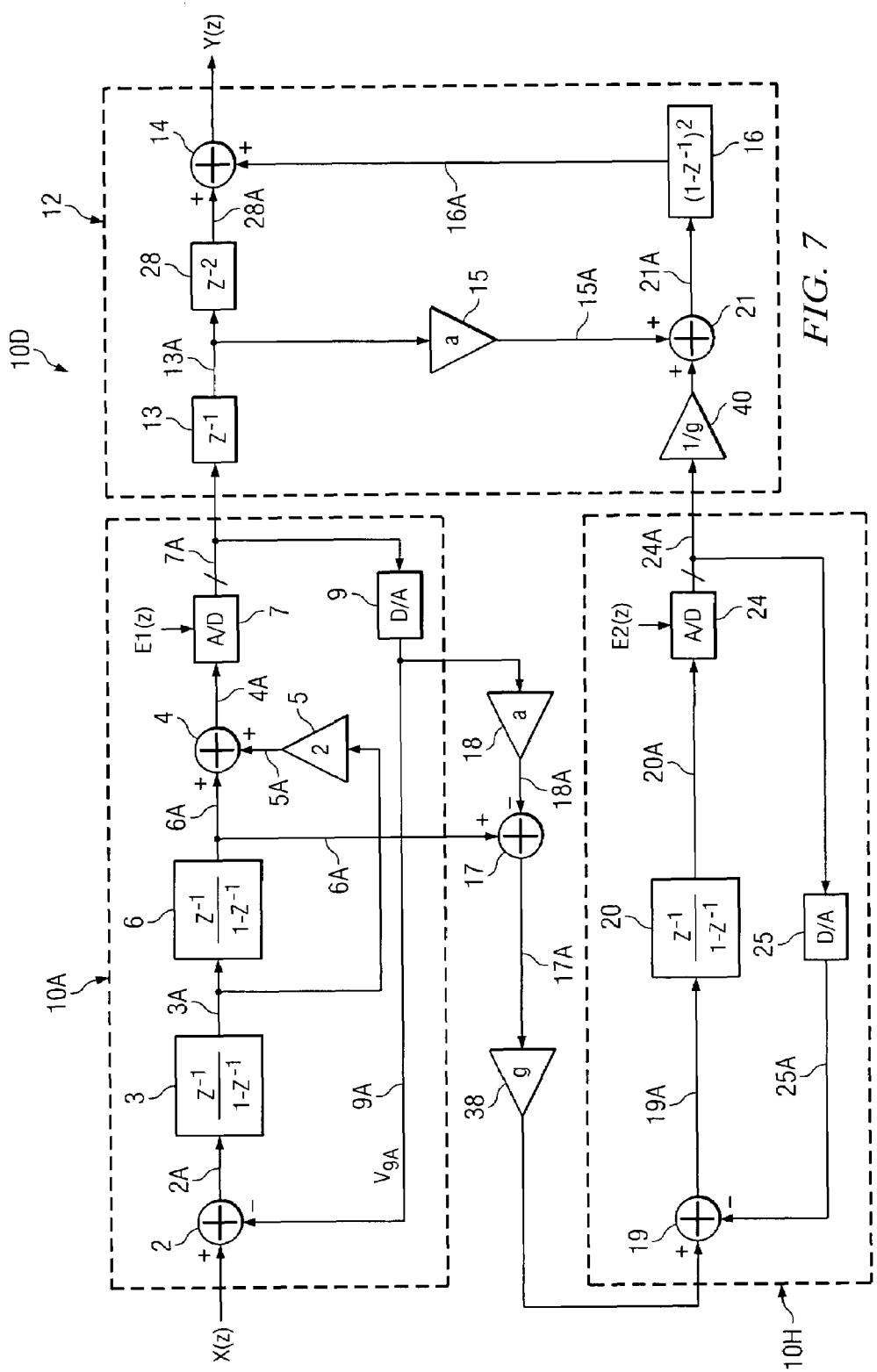
FIG. 7 is a block diagram of a cascaded delta-sigma modulator including the delta-sigma modulator of FIG. 4 as a first stage and a first order delta-sigma modulator as a second stage.
Figure 8:
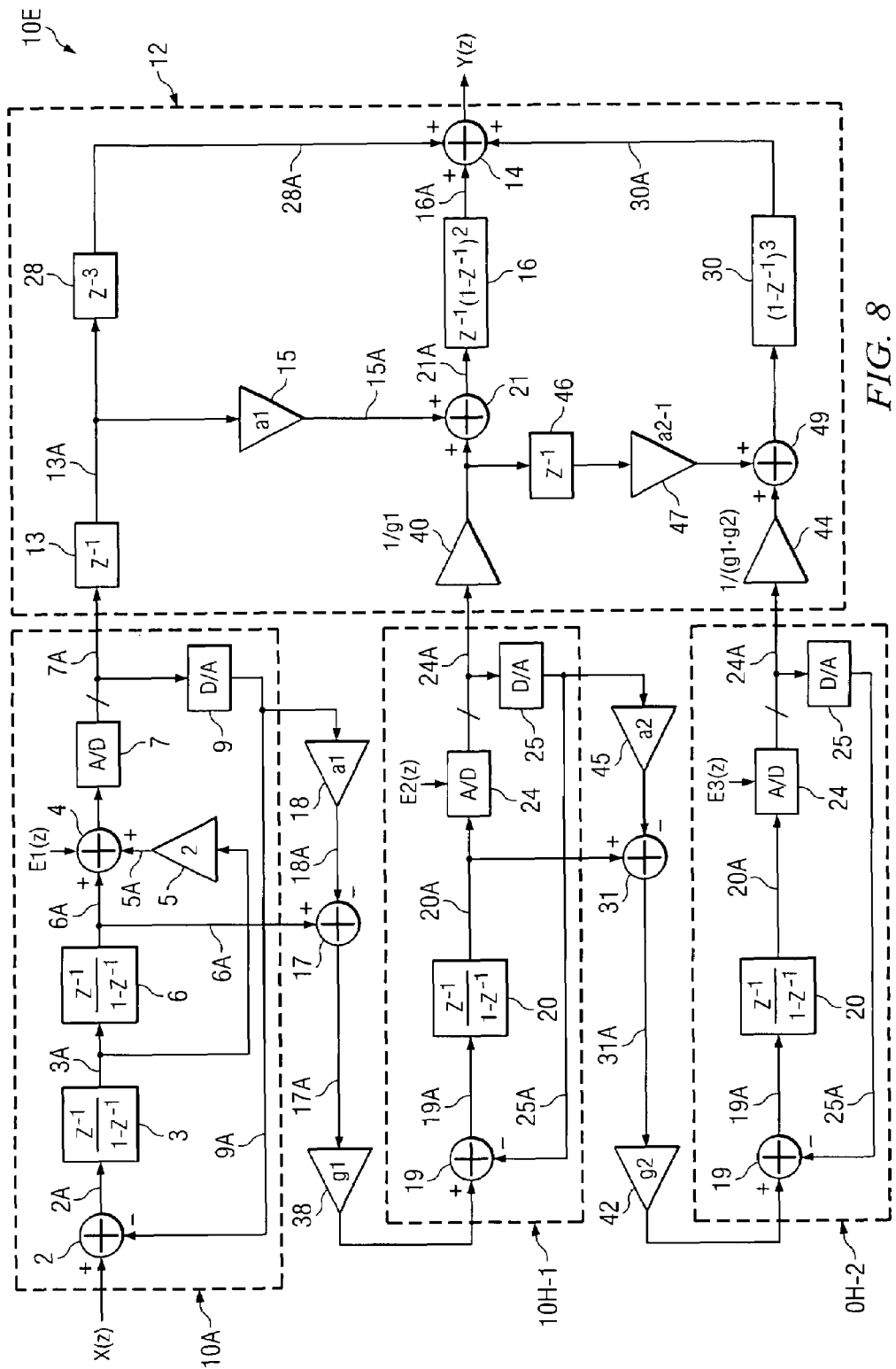
FIG. 8 is a block diagram of a cascaded delta-sigma modulator including the delta-sigma modulator of FIG. 4 as a first stage, a first order delta-sigma modulator as a second stage, and another first order delta-sigma modulator as a third stage.

The cascaded delta-sigma modulators of FIGS. 7 and 8 are somewhat similar to the one in FIG. 5B. Referring to FIG. 7, a cascaded delta-sigma modulator 10D includes a first stage 10A which is identical to the second order delta-sigma modulator 10A of FIG. 4 as a first stage, and further includes a first order delta-sigma modulator 10H as a second stage. Cascaded delta-sigma modulator 10H also includes error cancellation circuitry 12 as in cascaded delta-sigma modulator 10B of FIG. 5B. First order delta-sigma modulator 10H in FIG. 7 includes an analog adder 19, the output 19A of which is connected to the input of a switched capacitor integrator 20. The output 20A of integrator 20 is connected to the input of A/D or quantizer 24, the output 35A of which is connected to the input of D/A 25. The output 25A of D/A 25 is connected to a (−) input of adder 32. Quantization noise E2(z) of first order delta-sigma modulator 10H can be considered an additional input to A/D or quantizer 24. The output 24A of first order delta-sigma modulator 10H is connected to the input of digital gain block 40 of error cancellation circuit 12.

The transfer characteristic of cascaded delta-sigma modulator 10D of FIG. 7 is given by $$Y(z) = [X(z) + (1-z^{-1})^2(E_1(z) - X(z))]z^{-3} + \qquad \text{Eq. (7)}$$

-continued
$$[z^{-1}(-z^{-2}(E_1(z) - X(z))g) + (1-z^{-1})E_2(z)]$$
$$(1-z^{-1})^2 g$$
$$= z^{-3} X(z) + (1-z^{-1})^3 E_2(z) / g.$$

and, as will be recognized by those skilled in the art, is relatively flat and has substantially attenuated quantization noise.

FIG. 8 shows a cascaded delta-sigma modulator 10E including the second order delta-sigma modulator 10A of FIG. 4 as a first stage and further includes two identical first-order delta-sigma modulators 10H-1 and 10H-2 as second and third stages, respectively. Cascaded delta-sigma modulator 10B also includes error cancellation circuitry 12 similar to that in FIG. 5B. Each of first order delta-sigma modulators 10H-1 and 10H-2 includes an adder 19 having an output 19A connected to the input of a switched capacitor integrator 20. Integrator 20 has an output 20A connected to the input of an A/D or quantizer 24 which also can be thought of as receiving a signal E2(z) or E3(z) representative of quantization noise. The A/D or quantizer 24 has a 1-bit or multi-bit output 24A connected to the input of D/A converter 25, the output 25A of which is connected to the (−) input of adder 19. The (+) input of adder 19 receives the input signal of each first order delta-sigma modulator.

The (+) input of first order delta-sigma modulator 10H-1 is connected to the output of an analog gain block 38 having a gain g1. The input of gain block 38 is connected to the output 17A of adder 17, the (−) input of which is connected to the output 18A of an analog gain block a1 having a gain a1. The input of gain block 18 is connected to the output 9A of second order delta-sigma modulator 10A. The(+) input of adder 17 is connected to the output 6A of integrator 6 of second order delta-sigma modulator 10A.

The (+) input of adder 19 of first order delta-sigma modulator 10H-2 is connected to the output of an analog gain block 42 having a gain g2. The input of gain block 42 is connected to the output 31A of an adder 31, the (−) input of which is connected to the output 45A of an analog gain block 45 having a gain a2. The input of gain block 45 is connected to the output 25A of D/A 25 of first order delta-sigma modulator 10H-1. The (+) input of adder 31 is connected to the output 20A of integrator 20 of first order delta-sigma modulator 10H-1.

The output 24A of A/D or quantizer 24 of first-order delta-sigma modulator 10H-1 is connected to the input of digital gain block 40 of the error cancellation circuit 12. Digital gain block 40 has a gain 1/(g1). Similarly, the output 24A of A/D or quantizer 24 of first-order delta-sigma modulator 10H-2 is connected to the input of digital gain block 44 of error cancellation circuit 12 and has a gain 1/(g1g2). The output of digital gain block 40 is connected to the input of a digital delay element 46, the output of which is connected to the input of a digital gain block 47 having a gain a2−1. The output of digital gain block 47 is connected to a (+) input of digital adder 49, another (+) input of which is connected to the output of digital gain block 44. The output of digital adder 49 is connected to the input of a digital a high pass filter 30, the output of which is connected to a (+) input of digital adder 14.

The transfer characteristic of cascaded delta-sigma modulator 10E of FIG. 8 is given by $$Y(z) = [X(z) + (1-z^{-1})^2(E_1(z) - X(z))]z^{-4} +$$

$$[z^{-1}(-z^{-2}(E_1(z) - X(z))g1) + (1-z^{-1})E_2(z)]$$

$$z^{-1}(1-z^{-1})^2/g1 + [z^{-1}(-E_2(z)g2) + (1-z^{-1})E_3(z)]$$

$$(1-z^{-1})^3/g1g2$$

$$= z^{-4}X(z) + (1-z^{-1})^4 E_3(z)/g1g2$$

Eq. (8)

and also is relatively flat and is characterized by substantially attenuated quantization noise.

A benefit of the above described embodiments of the invention is that the output voltage swings of the first stage integrators are reduced compared to the output voltage swings in the first stage integrators of the prior cascaded delta-sigma modulators. The DC gain requirements and settling accuracy requirements of the first stage integrators also are reduced. Smaller integration capacitors can be used, reducing the amount of required integrated circuit chip area, and the reduced requirements on settling accuracy result in a reduction in power consumption of the integrators. The transfer characteristics are flat. The digital error cancellation provides flat input-output transfer functions without use of signal feed-forward paths and therefore avoids the kick-back effect problems of the prior art. The described embodiments of the invention are relatively simple to implement, more immune to distortion, and consume less power than the cascaded delta-sigma modulators of the prior art.

The above described embodiments of the invention take advantage of the fact that the "merger block" or error cancellation circuit 12 is utilized. The described embodiments of the invention also are based on configuring the error cancellation circuit 12 such that the flatness of the passbands of the cascaded delta-sigma modulators are "recovered" despite non-flatness of the first stage converter 100A and/or the second stage converter 100B, although if the second stage converter has the transfer function of OUT(z)=IN(z)+G(z)E2(z), or if n=0, then the error cancellation circuit 12 in some of the described embodiments would be the same as error cancellation circuit 12 in FIG. 2.

Figure 3:
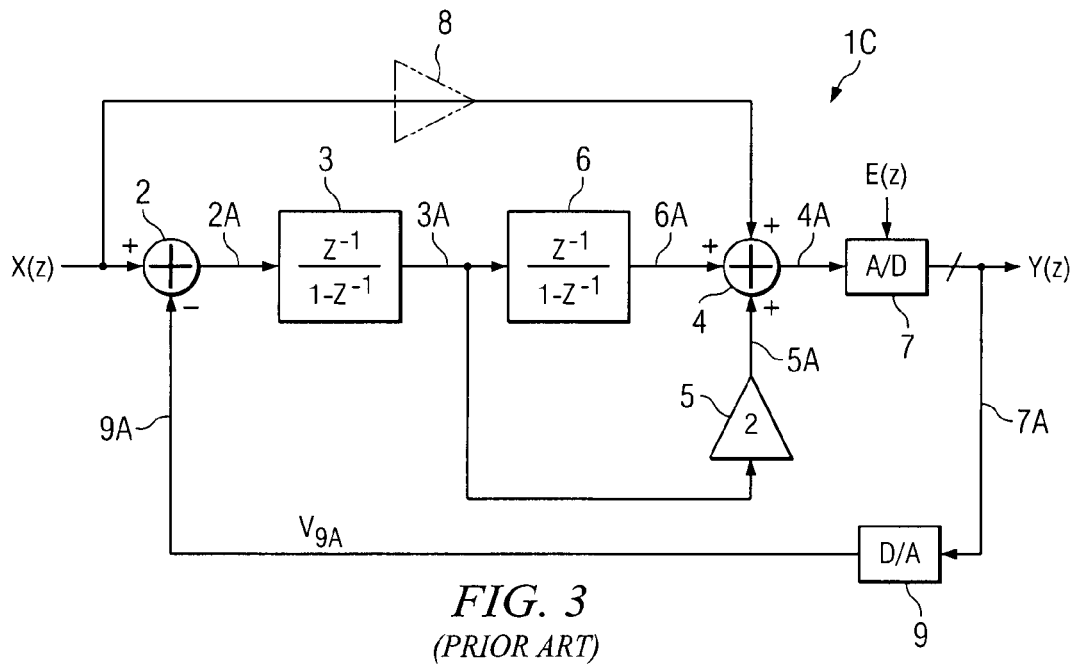
FIG. 3 is a block diagram of a prior art low distortion second-order delta-sigma modulator.

As previously indicated, prior art low distortion delta-sigma modulator 10A in FIG. 4 provides much of the same benefit as prior art low distortion delta-sigma modulator 1C in FIG. 3 without the burden of the feed-forward path from the input X(Z) to the input of quantizer 7. However, delta-sigma modulator 10A also has the shortcoming that the flatness of its passband is comprised. It should be appreciated that the second order delta-sigma modulator 1C of FIG. 3 could be used as the first stage converter in FIGS. 5A, 5B, and 6-8 if the complexity of the digital filter (FIG. 5A) is increased. Or, delta-sigma modulator 1C of FIG. 3 could be used as the first converter stage 100A if the previously described kick-back effect in delta-sigma modulator 1C of FIG. 3 is avoided, although at additional cost, by providing an optional buffer 8 as shown in dashed lines between the input signal X(z) and the (+) input of adder 4.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A cascaded delta-sigma modulator comprising:
   (a) a first stage converter including a first stage delta-sigma modulator including first and second adders, first and second integrators, a gain circuit, and a quantizer, first and second inputs of the first adder being coupled to an input signal and an output of the quantizer, respectively, an output of the first adder being coupled to an input of the first integrator, an output of the first integrator being coupled to an input of the second integrator and an input of the gain circuit, first and second inputs of the second adder being coupled to an output of the second integrator and an output of the gain circuit, respectively, an output of the second adder being coupled by means of a digital to all analog converter to an input of the quantizer;
   (b) a second stage converter having a transfer function represented by the expression OUT(z)=$z^{-n}$IN(z)+G(z)E2(z), where n can be any number, wherein OUT(z) and IN(z) are an output and input, respectively, of the second stage converter in the frequency domain, wherein $z^{-n}$ represents delay, G(z) represents a noise transfer function, and E2(z) represents noise in the second stage converter;
   (c) a first interstage circuit including a first interstage gain circuit having an input coupled to the output of the second integrator of the first stage delta-sigma modulator, an adder of the first interstage circuit having a first input coupled to the output of the second integrator of the first stage delta-sigma modulator, a second input coupled to an output of the first interstage gain circuit, and an output coupled to an input of a second interstage gain circuit having an output coupled to the input of the second stage converter; and
   (d) an error cancellation circuit for canceling quantization error, including a first input coupled to the output of the quantizer of the first stage delta-sigma modulator, a second input coupled to the output of the second stage converter, and an output producing an output signal so as to provide a flat transfer function of the cascaded first and second stage converters and the error cancellation circuit in combination despite non-flatness in a transfer function of the first stage second order delta-sigma modulator.

2. The cascaded delta-sigma modulator of claim 1 wherein the second stage converter includes a second stage delta-sigma modulator including a first adder having an output coupled to an input of a first integrator of the second stage delta-sigma modulator, the first integrator of the second stage delta-sigma modulator having an output coupled to an input of a quantizer of the second stage delta-sigma modulator, the quantizer of the second stage delta-sigma modulator having an output coupled to a first input of the first adder of the second stage delta-sigma modulator.

3. The cascaded delta-sigma modulator of claim 1 wherein the first stage delta-sigma modulator does not include any feed-forward paths from the input signal to the second adder of the first stage delta-sigma modulator.

4. The cascaded delta-sigma modulator of claim 1 wherein the quantizer of the first stage delta-sigma modulator is a multi-bit quantizer.

5. The cascaded delta-sigma modulator of claim 1 wherein the quantizer of the first stage delta-sigma modulator is a 1-bit quantizer.

6. The cascaded delta-sigma modulator of claim 1 wherein the first stage delta-sigma modulator is a second order delta-sigma modulator having a transfer function defined by $Y(z)=X(z)+(1-z^{-1})^2(E(z)-X(z))$ where $Y(z)$, $X(z)$, and $E(Z)$ represent the output, input, and quantization error, respectively, of the first stage delta-sigma modulator in the frequency domain.

7. The cascaded delta-sigma modulator of claim 6 wherein the second stage delta-sigma modulator is a second order delta-sigma modulator having a transfer function defined by $Y(z)=z^{-2}X(z)+(1-z^{-1})^2E(z)$ where $Y(z)$, $X(z)$, and $E(z)$ represent the output, input, and quantization error, respectively, of the second stage delta-sigma modulator in the frequency domain, and wherein the cascaded delta-sigma modulator has a transfer function defined by $Y(z)=z^{-4}X(z)+(1-z^{-1})^4E_2(z)/g$ where $Y(z)$ and $X(z)$ represent the output and the input, respectively, of the cascaded delta-sigma modulator and $E_2(z)$ represents quantization error associated with the second stage delta-sigma modulator and g represents gain of the second interstage gain circuit.

8. The cascaded delta-sigma modulator of claim 1 wherein the first integrator and second integrator of the first stage delta-sigma modulator are switched capacitor integrators each including a first switched capacitor sampling circuit for sampling the input signal and an integrating operational amplifier having a differential input coupled to a differential output of the first switched capacitor sampling circuit, and wherein the first adder of the first stage delta-sigma modulator includes a second switched capacitor sampling circuit having an input coupled to sample an output of the digital to analog converter and a differential output connected to the differential input of the integrating operational amplifier.

9. The cascaded delta-sigma modulator of claim 6 wherein the gain circuit of the first stage delta-sigma modulator has a gain equal to 2.

10. The cascaded delta-sigma modulator of claim 2 wherein the second stage delta-sigma modulator is a first order delta-sigma modulator and wherein the cascaded delta-sigma modulator has a transfer function defined by $Y(z)=z^{-3}X(z)+(1-z^{-1})^3E_2(z)/g$ where $Y(z)$ and $X(z)$ represent the output and input, respectively, of the cascaded delta-sigma modulator, $E_2(z)$ represents quantization noise of the first order delta-sigma modulator of the second stage delta-sigma modulator, and g represents gain of the second interstage gain circuit.

11. The cascaded delta-sigma modulator of claim 2 wherein the first stage delta-sigma modulator is a second order delta-sigma modulator having a transfer function defined by $Y(z)=X(z)+(1-z^{-1})^2(E(z)-X(z))$ where $Y(z)$, $X(z)$, and $E(z)$ represent the output, input, and quantization noise, respectively, of the second order delta-sigma modulator in the frequency domain, and wherein the second stage delta-sigma modulator is a second order delta-sigma modulator having a transfer function defined by $Y(z)=z^{-2}X(z)+(1-z^{-1})^2E(z)$ where $Y(z)$, $X(z)$, and $E(z)$ represent the output, input, and quantization noise, respectively, of the second stage delta-sigma modulator in the frequency domain, the cascaded delta-sigma modulator further including a third stage delta-sigma modulator which is a first order delta-sigma modulator, the cascaded delta-sigma modulator having a transfer characteristic defined by $Y(z)=z^{-5}X(z)+(1-z^{-1})^5E_3(z)/g1g2$ where $Y(z)$ and $X(z)$ represent the output and input, respectively, of the cascaded delta-sigma modulator in the frequency domain, $E_3(z)$ represents quantization noise of the third stage delta-sigma modulator, g1 represents gain of the second interstage gain circuit, and g2 represents gain of an interstage gain circuit coupled between the second stage delta-sigma modulator and the third stage delta-sigma modulator.

12. The cascaded delta-sigma modulator of claim 1 wherein the second stage delta-sigma modulator is a first order delta-sigma modulator and wherein the cascaded delta-sigma modulator further includes a third stage delta-sigma modulator which is a first order delta-sigma modulator, the cascaded delta-sigma modulator having a transfer characteristic defined by $Y(z)=z^{-4}X(z)+(1-z^{-1})^4E_3(z)/(g1g2)$ where $Y(z)$ and $X(z)$ represent the output and input, respectively, of the cascaded delta-sigma modulator in the frequency domain, $E_3(z)$ represents quantization noise of the third stage delta-sigma modulator, g1 represents gain of the second interstage gain circuit, and g2 represents gain of an interstage gain circuit coupled between the second stage delta-sigma modulator and the third stage delta-sigma modulator, wherein the error cancellation circuit includes a third input coupled to an output of a quantizer of the third stage delta-sigma modulator.

13. The cascaded delta-sigma modulator of claim 1 wherein the error cancellation circuit includes a first digital delay circuit having an input coupled to the output of the quantizer of the first stage delta-sigma modulator and an output coupled to an input of a second digital delay circuit and to an input of a first digital gain circuit, an output of the second digital delay circuit being coupled to a first input of a first digital adder, a second digital gain circuit having an input coupled to the output of the second stage converter and an output coupled to a first input of a second digital adder, the second digital adder having a second input coupled to an output of the first digital gain circuit and an output coupled to an input of a digital filter circuit, the digital filter circuit having an output coupled to a second input of the first digital adder.

14. The cascaded delta-sigma modulator of claim 2 including a third stage delta-sigma modulator having an input coupled to the output of the second stage delta-sigma modulator and also having an output, and wherein the error cancellation circuit includes a first digital delay circuit having an input coupled to the output of the quantizer of the first stage delta-sigma modulator and an output coupled to an input of a second digital delay circuit and to an input of a first digital gain circuit, an output of the second digital delay circuit being coupled to a first input of a first digital adder, a second digital gain circuit having an input coupled to the output of the second stage converter and an output coupled to a first input of a second digital adder, the second digital adder having a second input coupled to an output of the first digital gain circuit and an output coupled to an input of a first digital filter circuit, the first digital filter circuit having an output coupled to a second input of the first digital adder, the error cancellation circuit also including a third digital gain circuit having an input coupled to the output of the third stage delta-sigma modulator and an output coupled to a first input of a third digital adder, the output of the second digital gain circuit being coupled to an input of a third digital delay element having an output coupled to an input of a fourth digital gain circuit, the fourth digital gain circuit having an output coupled to a second input of the third digital adder, the third digital adder having an output coupled to an input of a second digital filter circuit having an output coupled to a third input of the first digital adder.

15. A method of cascading a first stage converter and a second stage converter, the method comprising:
(a) providing in the first stage converter a first stage delta-sigma modulator including first and second adders, first and second integrators, a gain circuit, and a quantizer, first and second inputs of the first adder being coupled to an input signal and an output of the quantizer, respectively, an output of the first adder being coupled to an input of the first integrator, an output of the first integrator being coupled to an input of the second integrator and an input of the gain circuit, first and second inputs of the second adder being coupled to an output of the second integrator and an output of the gain circuit, respectively, an output of the second adder being coupled to an input of the quantizer;

(b) coupling the output of the quantizer to an input of the second stage converter, wherein the second stage converter has a transfer function represented by the expression $OUT(z)=z^{-n}IN(z)+G(z)E2(z)$, where n can be any number, wherein $OUT(z)$ and $IN(z)$ are the output and input, respectively, of the second stage converter in the frequency domain, wherein $z^{-n}$ represents delay, $G(z)$ represents a noise transfer function, and $E2(z)$ represents any noise in the second stage converter; and (c) coupling the output of the quantizer of the first stage delta-sigma modulator and an output of the second stage converter to first and second inputs, respectively, of an error cancellation circuit including a first input coupled to the output of the quantizer of the first stage delta-sigma modulator, a second input coupled to the output of the second stage converter so as to provide a flat transfer function of the cascaded first and second stage converters and the error cancellation circuit in combination despite non-flatness in a transfer function of the first stage delta-sigma modulator.

16. The method of claim 15 wherein step (a) includes providing the first stage delta-sigma modulator without direct feed-forward coupling of the input signal to the second adder of the first stage delta-sigma modulator.

17. The method of claim 15 including performing the coupling of step (b) by means of a first interstage circuit including a first interstage gain circuit having an input coupled to the second input of the first adder of the first stage delta-sigma modulator, an adder having a first input coupled to the output of the second integrator of the first stage delta-sigma modulator, a second input coupled to an output of the first interstage gain circuit, and an output coupled to an input of a second interstage gain circuit having an output coupled to the input of the second stage converter.

18. The method of claim 15 including providing the first stage delta-sigma modulator with a transfer characteristic defined by $Y(z)=X(z)+(1-z^{-1})^2(E(z)-X(z))$ where $Y(z)$, $X(z)$, and $E(Z)$ represent the output, input, and quantization error, respectively, of the first stage delta-sigma modulator in the frequency domain.

19. The method of claim 15 including providing in the second stage converter a second stage delta-sigma modulator including an adder having an output coupled to an input of a first integrator of the second stage delta-sigma modulator, the first integrator of the second stage delta-sigma modulator having an output coupled to an input of a quantizer of the second stage delta-sigma modulator, the quantizer of the second stage delta-sigma modulator having an output coupled to a first input of the adder of the second stage delta-sigma modulator.

20. A cascaded delta-sigma modulator comprising:

(a) a first stage converter including a first stage delta-sigma modulator means which includes first and second adders, first and second integrators, a gain circuit, and a quantizer, first and second inputs of the first adder being coupled to an input signal and an output of the quantizer, respectively, an output of the first adder being coupled to an input of the first integrator, an output of the first integrator being coupled to an input of the second integrator and an input of the gain circuit, first and second inputs of the second adder being coupled to an output of the second integrator and an output of the gain circuit, respectively, an output of the second adder being coupled to an input of the quantizer;

(b) means for coupling the output of the quantizer to an input of second stage converter means which has a transfer function represented by the expression $OUT(z)=z^{-n}IN(z)+G(z)E2(z)$, where n can be any number, wherein $OUT(z)$ and $IN(z)$ are the output and input, respectively, of the second stage converter in the frequency domain, wherein $z^{-n}$ represents delay, $G(z)$ represents a noise transfer function, and $E2(z)$ represents noise in the second stage converter, and means for coupling the output of the quantizer to an input of the second stage converter means; and (c) error cancellation circuit means including a first input coupled to the output of the quantizer of the first stage delta-sigma modulator, a second input coupled to the output of the second stage converter means, and an output producing an output signal so as to provide a flat transfer function of the cascaded first and second stage converter means and the error cancellation circuit in combination despite non-flatness in a transfer function of the first stage delta-sigma modulator.

* * * * *